(12) United States Patent
Lee

(10) Patent No.: US 8,188,565 B2
(45) Date of Patent: May 29, 2012

(54) SEMICONDUCTOR CHIP AND SHIELDING STRUCTURE THEREOF

(75) Inventor: Sheng-Yuan Lee, Taipei Hsien (TW)

(73) Assignee: VIA Technologies, Inc., New Taipei (TW)

( * ) Notice: Subject to any disclaimer, the term of this patent is extended or adjusted under 35 U.S.C. 154(b) by 510 days.

(21) Appl. No.: 12/118,371

(22) Filed: May 9, 2008

(65) Prior Publication Data

US 2008/0203580 A1 Aug. 28, 2008

Related U.S. Application Data

(63) Continuation-in-part of application No. 11/436,849, filed on May 17, 2006, now abandoned.

(30) Foreign Application Priority Data

Dec. 9, 2005 (TW) .............................. 94143540 A

(51) Int. Cl.
*H01L 23/48* (2006.01)

(52) U.S. Cl. . 257/508; 257/620; 257/758; 257/E23.179; 257/E23.194; 257/E21.546; 438/460

(58) Field of Classification Search .................. 257/620, 257/E23.179, E23.194, E21.546, 758, 508; 438/460
See application file for complete search history.

(56) References Cited

U.S. PATENT DOCUMENTS

| 5,475,255 | A | * | 12/1995 | Joardar et al. | ................. | 257/547 |
| 5,990,537 | A | * | 11/1999 | Endo et al. | ..................... | 257/529 |
| 6,412,786 | B1 | * | 7/2002 | Pan | ................................ | 277/630 |
| 6,429,502 | B1 | * | 8/2002 | Librizzi et al. | ................ | 257/510 |
| 2004/0150070 | A1 | * | 8/2004 | Okada et al. | ..................... | 257/508 |
| 2005/0212071 | A1 | * | 9/2005 | Yue et al. | ...................... | 257/452 |

* cited by examiner

*Primary Examiner* — Eugene Lee
*Assistant Examiner* — Peniel M Gumedzoe
(74) *Attorney, Agent, or Firm* — J.C. Patents

(57) ABSTRACT

A semiconductor chip including a substrate, a metal interconnection structure and a circuit region is provided. The substrate has at least one dielectric ring on a substrate surface of the substrate. The metal interconnection structure is disposed on the substrate surface and has at least one guard ring, wherein the guard ring comprises a plurality of individual segments, and the individual segments are individually and electrically coupled to the ground contacts. The circuit region disposed on the substrate. A projection of the dielectric ring on the substrate surface surrounds a projection of the circuit region on the substrate surface, and the projection of the guard ring on the substrate surface surrounds that of the dielectric ring and that of the circuit region on the substrate surface.

24 Claims, 7 Drawing Sheets

SEMICONDUCTOR CHIP AND SHIELDING STRUCTURE THEREOF

CROSS-REFERENCE TO RELATED APPLICATION

This is a continuation-in-part application of patent application Ser. No. 11/436,849 filed on May 17, 2006, which claims the priority benefit of Taiwan patent application serial no. 94143540, filed Dec. 9, 2005. The entirety of each of the above-mentioned patent applications is hereby incorporated by reference herein and made a part of this specification.

BACKGROUND OF THE INVENTION

1. Field of the Invention

The present invention relates to a semiconductor chip, and more particularly, to a semiconductor chip with a shielding structure.

2. Description of the Related Art

Along with the performance improvements of the integrated circuit (IC) chip, the transmission frequency of the electronic signals in the IC chip increases continuously. However, when the frequency of the electronic signals is increased to a high-frequency range, for example, higher than 10 GHz, the electronic signals inside the IC chip can easily be interfered by the noises.

FIG. 1 is a partial schematic view of a conventional IC chip. FIG. 2 is a top view of the IC chip in FIG. 1. Referring to FIGS. 1 and 2, the IC chip 100 mainly comprises a substrate 110, a metal interconnection structure 120, a plurality of signal contacts 130, and a plurality of ground contacts 140. More particularly, many active solid-sate devices are disposed on a surface 112 of the substrate 110. For example, the active solid-state devices are the bipolar junction transistors (BJT) or the field-effect transistors (FET) disposed on the silicon substrate. The metal interconnection structure 120 consists of the insulating layers and the conductive layers sequentially disposed on the surface 112 of the substrate 110, and the signal contacts 130 and the ground contacts 140 are both disposed on a surface of the metal interconnection structure 120.

In addition, in order to prevent the signal contacts 130 from being interfered by the noise, a guard ring 122 design is further applied. Specifically, in the conventional technique, the guard rings 122 surround the periphery of the signal contacts 130, and the guard ring 122 is electrically coupled to the ground contact 140 through a trace 124. Accordingly, when a ground line 150 is electrically coupled to the ground contact 140 and a ground (not shown) by a wire bonding process in the conventional technique, the guard ring 122 can be electrically coupled to the ground outside of the IC chip 100 through the trace 124, the ground contact 140, and the ground line 150.

In general, when the operation frequency of the IC chip 100 is in a low-frequency range, since the parasitic phenomenon between the guard ring 122 and the ground can be ignored. For example, the be-ignored parasitic phenomenon includes the parasitic inductance between the trace 124, the ground contact 140, and the ground line 150. Thus, the noise on the signal contact 130 is smoothly expelled from the IC chip 100 through the guard ring 122, the trace 124, the ground contact 140, and the ground line 150. Accordingly, when the electronic signal is in the low-frequency range, the guard ring 122 design in the conventional technique can protect the signal contact 130 from been interfered by the noise.

However, when the operation frequency of the IC chip 100 is in a high-frequency range, the above-mentioned parasitic phenomenon induced by the trace 124, the ground contact 140, and the ground line 150 cannot be ignored. Specifically, since the guard ring 122 is electrically coupled to the ground contact 140 through the trace 124, if the guard ring 122, the trace 124, the ground contact 140, and the ground line 150 are regarded as a whole, and the reactance induced by the parasitic phenomenon is increased along with the rising of the operation frequency of the IC chip 100.

When the reactance induced by the parasitic phenomenon exceeds a threshold value, the noise on the signal contact 130 can not be smoothly expelled from the IC chip 110 to the ground through the guard ring 122. In other words, when the operation frequency of the IC chip 100 is in the high-frequency range, the guard ring 122 gradually loses its capability of protecting the signal contact 130 and the high-frequency electronic signal transmitted through the signal contact 130 is easily interfered by the noise, which deteriorates the performance of the IC chip 100.

SUMMARY OF THE INVENTION

Accordingly, a semiconductor chip including a substrate, a metal interconnection structure and a circuit region is provided by the present invention. The substrate has at least one dielectric ring is formed on a substrate surface of the substrate. The metal interconnection structure is disposed on the substrate surface and has at least one guard ring. The guard ring comprises a plurality of individual segments. The individual segments are individually and electrically coupled to the corresponding ground contacts. The circuit region lies on the substrate. A projection of the dielectric ring on the substrate surface surrounds a projection of the circuit region on the substrate surface, and the projection of the guard ring on the substrate surface surrounds that of the dielectric ring and that of the circuit region.

According to the present invention, a shielding structure suitable for a semiconductor chip is also provided. The semiconductor comprises a substrate, a metal interconnection structure, and a circuit region. The metal interconnection structure having a plurality of ground contacts is formed on a substrate surface of the substrate, and the circuit region is disposed on the substrate. The shielding structure comprises at least one dielectric ring and at least one guard ring. The dielectric ring is formed on the substrate surface, and a projection of the dielectric ring surrounds a projection of the circuit region on the substrate surface. The guard ring is formed of one of a plurality of conductive layers in the metal interconnection structure, wherein the conductive layers are interleavedly disposed. The guard ring comprises a plurality of individual segments, and the individual segments are individually and electrically coupled to the corresponding ground contacts. Moreover, a projection of the guard ring on the substrate surface surrounds that of the dielectric ring and that of the circuit region on the substrate surface.

BRIEF DESCRIPTION DRAWINGS

The accompanying drawings are included to provide a further understanding of the invention, and are incorporated in and constitute a portion of this specification. The drawings illustrate embodiments of the invention, and together with the description, serve to explain the principles of the invention.

DESCRIPTION PREFERRED EMBODIMENTS

Figure 1:
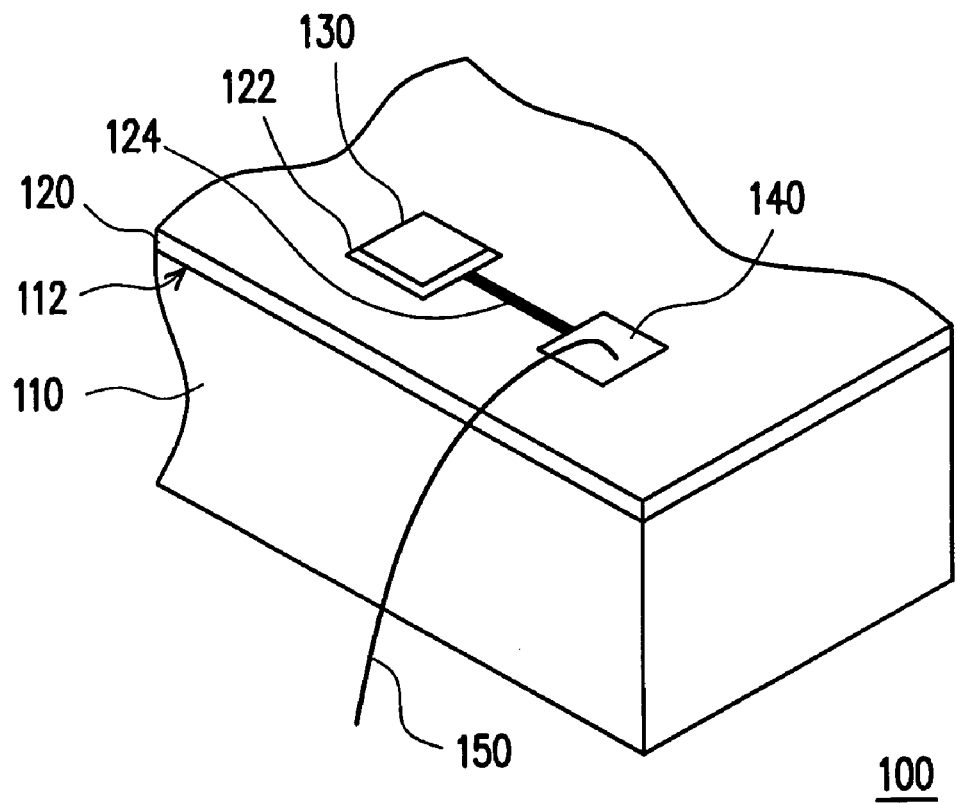
FIG. 1 is a partial schematic view of a conventional IC chip.
Figure 2:
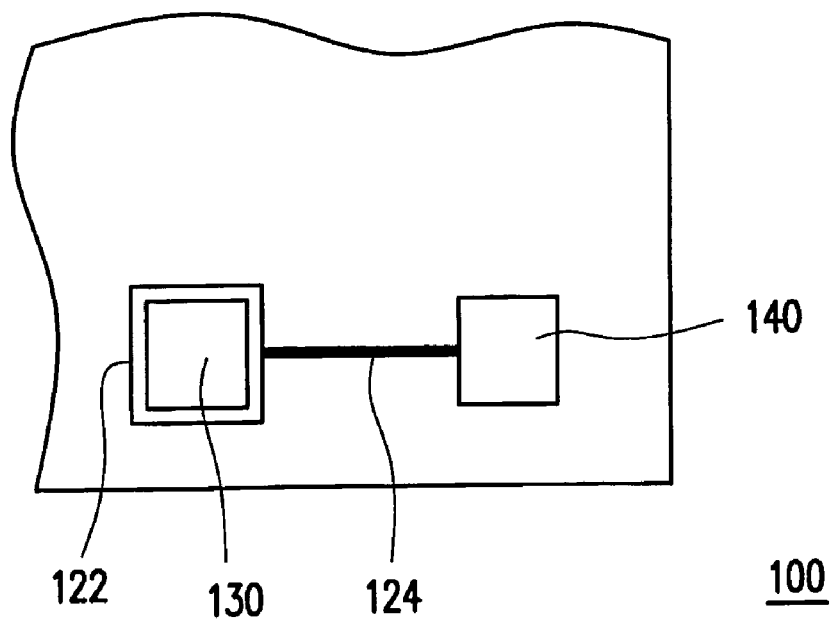
FIG. 2 is a top view of the IC chip in FIG. 1.
Figure 3:
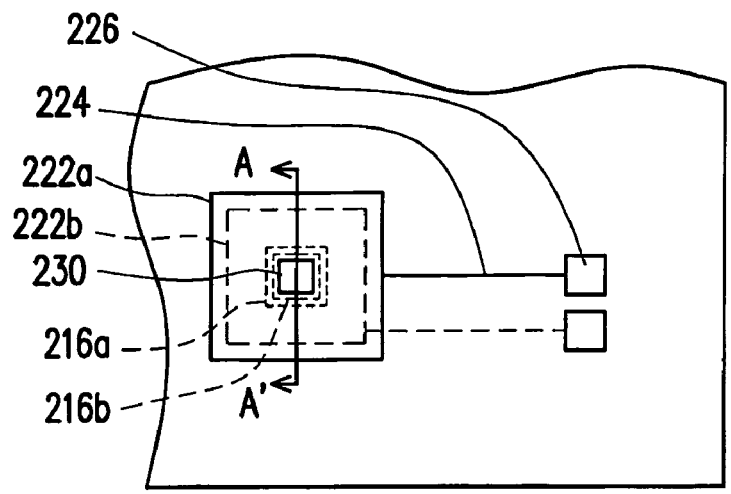
FIG. 3 is a partial top view of an IC chip according to an embodiment of the present invention.
Figure 4:
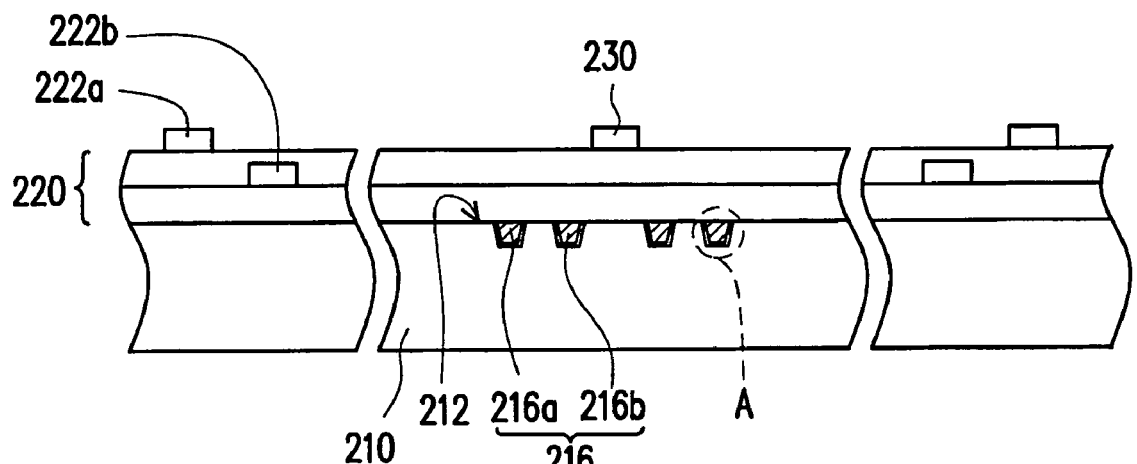
FIG. 4 is a cross-sectional view of the semiconductor chip from the A-A' sectional line of FIG. 3.

FIG. 3 is a partial top view of an IC chip according to an embodiment of the present invention. FIG. 4 is a cross-sectional view of the semiconductor chip viewing from the A-A' sectional line of FIG. 3. Referring to FIGS. 3 and 4, the semiconductor chip 200 comprises a substrate 210, a metal interconnection structure 220, and a circuit region 230. In this embodiment shown in FIG. 4, the circuit region 203 is a signal contact. The substrate 210 has a substrate surface 212. In addition, the substrate 210 further comprises a dielectric ring 216a disposed into the substrate surface 212 of the substrate 210. For example, the ring width of the dielectric ring 216a is 1.2 microns, and the distance between the dielectric ring 216a and the circuit region 230 is 10 microns. The interconnection structure 220 includes inter-dielectric layers and wirings (the layout of conductive layers and/or plugs) (not shown); however, for simplifying the descriptions, these detailed structures are omitted from the figures.

Figure 5:
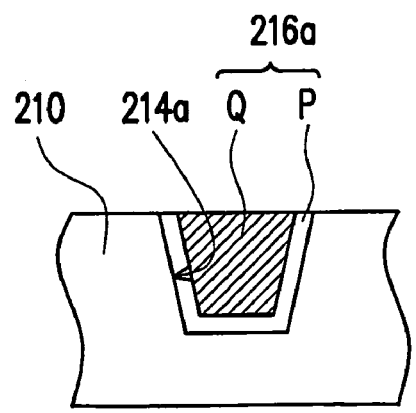
FIG. 5 is a magnified view of the region A of FIG. 4.

FIG. 5 is a magnified view of the region A of FIG. 4. In order to form the dielectric ring 216a, a deep trench 214a is formed by etching a specific area on the substrate surface 212 of the substrate 210. The dielectric layer further disposed into the deep trench 214a. In addition, the dielectric ring 216a is formed by a silicon oxide layer P and a polycide layer Q. The silicon oxide layer P is disposed on the inner surfaces of the deep trench 214a, and the polycide layer Q is disposed on the silicon oxide layer P. It is to be noted that in other embodiments of the present invention, the dielectric ring 216a may be only formed by a silicon oxide layer P, wherein the silicon oxide layer P is fully disposed in the deep trench 214.

Referring to FIG. 3 and FIG. 4, the metal interconnection structure 220 is disposed on the substrate surface 212, and a guard ring 222a is disposed on the metal interconnection structure 220. In the present embodiment, the guard ring 222a and the contact of the circuit region 230 can be formed of the same conductive layer. More particularly, the conductive layer is disposed on the surface of the metal interconnection structure 220 that is far away from the substrate 210, and the guard ring 222a and the circuit region 230 are formed from the conductive layer. Moreover, the guard ring 222a is electrically coupled to a ground contact 226 through a trace 224.

The circuit region 230 is disposed on the substrate 210. In the present embodiment, the circuit region 230 is a contact formed on the metal interconnection structure 220 (as shown in FIG. 4). The distance between the circuit region 230 and the guard ring 222a is 100 microns. It is to be noted that in the semiconductor chip 200 mentioned above, the projection of the dielectric ring 216a on the substrate surface 212 surrounds the projection of the circuit region 230 on the substrate surface 212, and the projection of the guard ring 222a on the substrate surface 212 surrounds that of the dielectric ring 216a and that of the circuit region 230 on the substrate surface 212.

In the structure mentioned above, when the semiconductor chip 200 is operated in the low-frequency operation clock, the guard ring 222a provides a better shielding effect for the noise. In addition, the structure of the dielectric ring 216a also provides a shielding effect for the noise in a wide frequency range. Accordingly, the semiconductor chip 200 provided by the present embodiment is not easily interfered by the noise, and the semiconductor chip 200 has better performance.

In the present embodiment, the metal interconnection structure 220 may be formed by either a single conductive layer or multiple conductive layers. Therefore, in the present embodiment, the guard ring may be disposed on the surface of the metal interconnection structure 220, such as the guard ring 222a shown in the FIG. 4, or may be disposed inside the metal interconnection structure 220, such as the guard ring 222b shown in FIG. 4. The guard rings 222a and 222b may be formed on the same conductive layer.

In addition, the present embodiment does not limit the number of the guard rings. In the present embodiment, the guard ring 222a and the guard ring 222b can be coexisted. It is obvious from the descriptions mentioned above that the semiconductor chip 200 in other embodiments of the present invention may include one or a plurality of guard rings. These guard rings are formed by part of the multiple interleaved conductive layers of the metal interconnection structure 220, and the projection of the guard rings on the substrate surface 212 surrounds that of the dielectric ring 216a and that of the circuit region 230 on the surface. The guard rings have a similar shape. Accordingly, the semiconductor chip 200 is not easily interfered by the noise, and the semiconductor chip can provide better performance.

Moreover, the semiconductor chip of the present invention may include one or a plurality of dielectric rings. In addition, the projection of the dielectric ring on the substrate surface is between that of the guard ring and that of the circuit region on the substrate surface. Here, the dielectric rings are separated from each other, and each guard ring has a similar shape.

For example, besides the dielectric ring 216a, the semiconductor chip 200 in FIGS. 3 and 4 may further include a dielectric ring 216b. The projection of the dielectric ring 216b on the substrate surface 212 is between that of the guard rings (e.g. the guard ring 222a and the guard ring 222b) and that of the circuit region 230 on the substrate surface 212. The dielectric ring 216a is separated from the dielectric ring 216b, and both dielectric rings 216 (216a and 216b) have a similar shape. Accordingly, the semiconductor chip 200 of the present embodiment is not easily interfered by the noise, and the semiconductor chip 200 can provide better performance.

Figure 6:
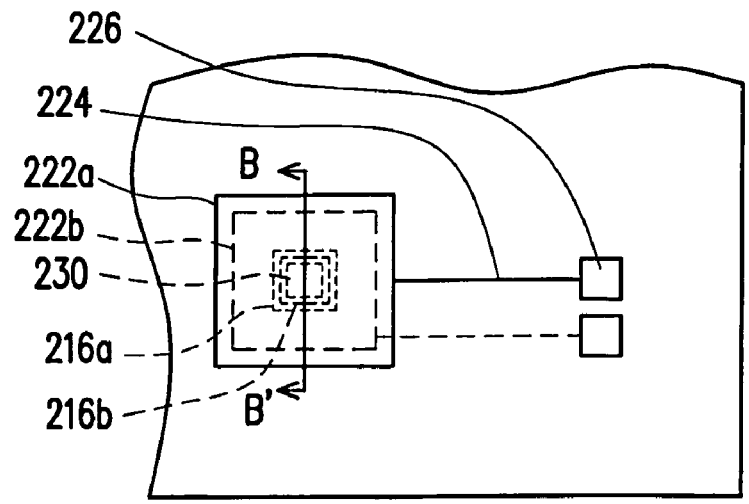
FIG. 6 is a partial top view of an IC chip according to another embodiment of the present invention.
Figure 7:
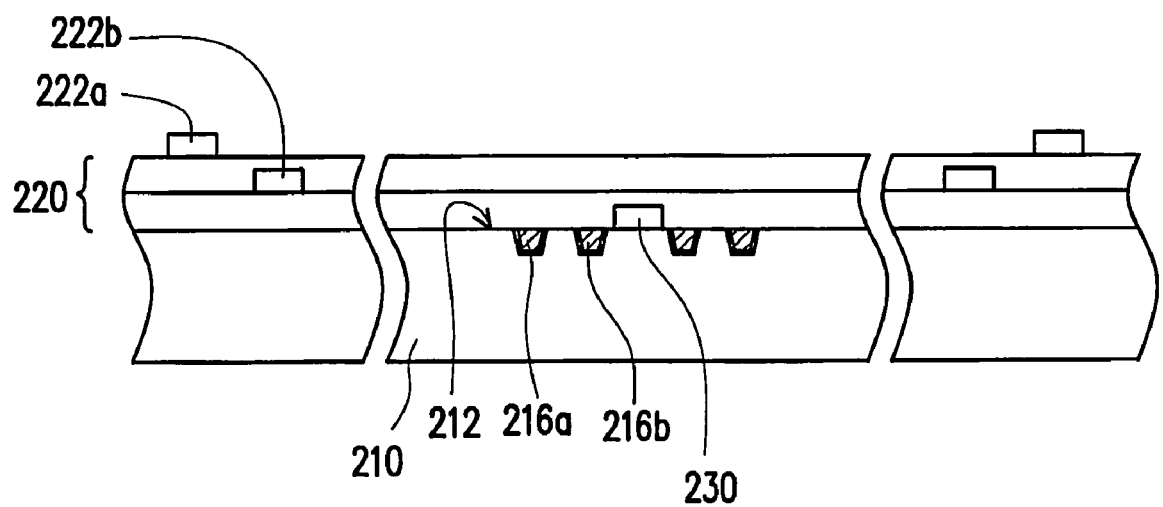
FIG. 7 is a cross-sectional view of the semiconductor chip from the B-B' sectional line of FIG. 6.

In addition, the circuit region 230 in the present embodiment is not limited to be on the surface of the metal interconnection structure 220. The circuit region 230 may be an active solid-state device disposed on the substrate surface 212 in other embodiments of the present invention as shown in FIGS. 6 and 7. FIG. 6 is a partial top view of an IC chip according to another embodiment of the present invention. FIG. 7 is a cross-sectional view of the semiconductor chip viewing from the B-B' sectional line of FIG. 6. Since the semiconductor chip 200' is similar to the semiconductor chip 200, the detailed description of the semiconductor chip 200' is omitted herein.

The semiconductor chip 200' differs from the semiconductor chip 200 mainly in that the circuit region 230 is disposed on the substrate surface 212, wherein the circuit region 230 may be a circuit component. The circuit component may be at least one active solid-state device, a passive device, a combination of the active and passive devices, and the responding wiring to perform a specific function. For example, the circuit component may be a transmitter, a receiver, a power amplifier, a voltage controlled oscillator (VCO), or a combination of the electronic components mentioned above. Alternatively, the circuit region 230 may refers to a circuit module, such as a passive circuit module, a memory module, a power supply module, a control & logic module, a transmitter module, or a receiver module.

Figure 8:
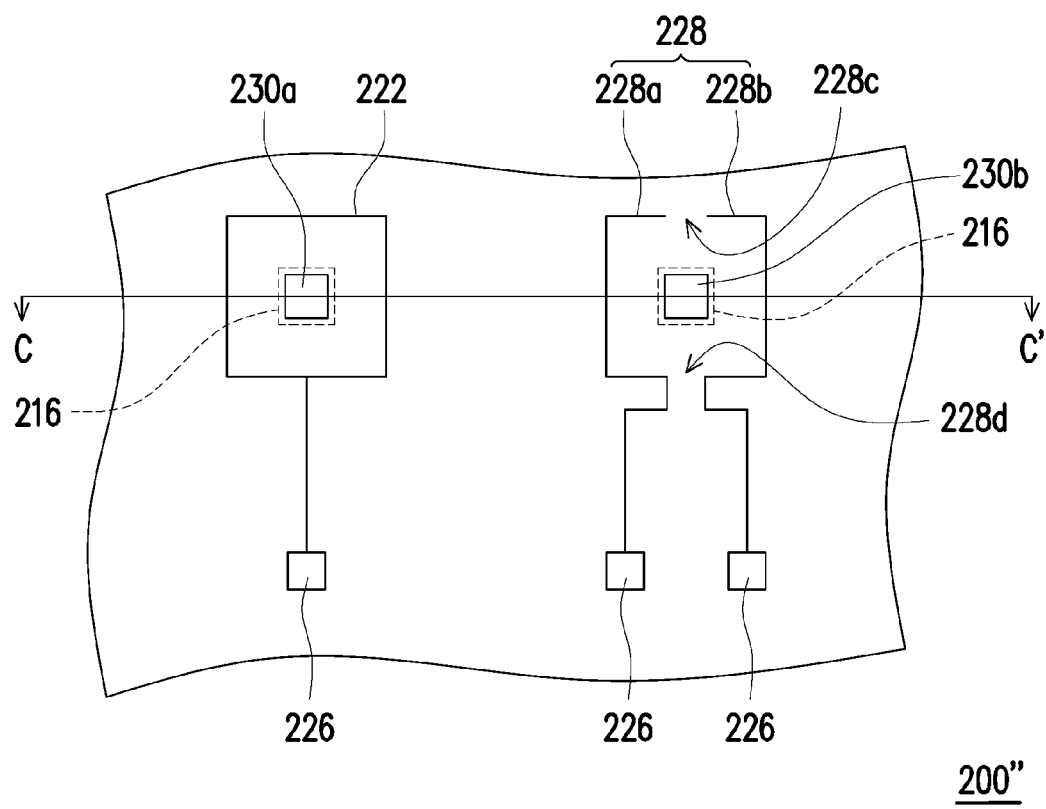
FIG. 8 is a partial top view of an IC chip according to another embodiment of the present invention.
Figure 9:
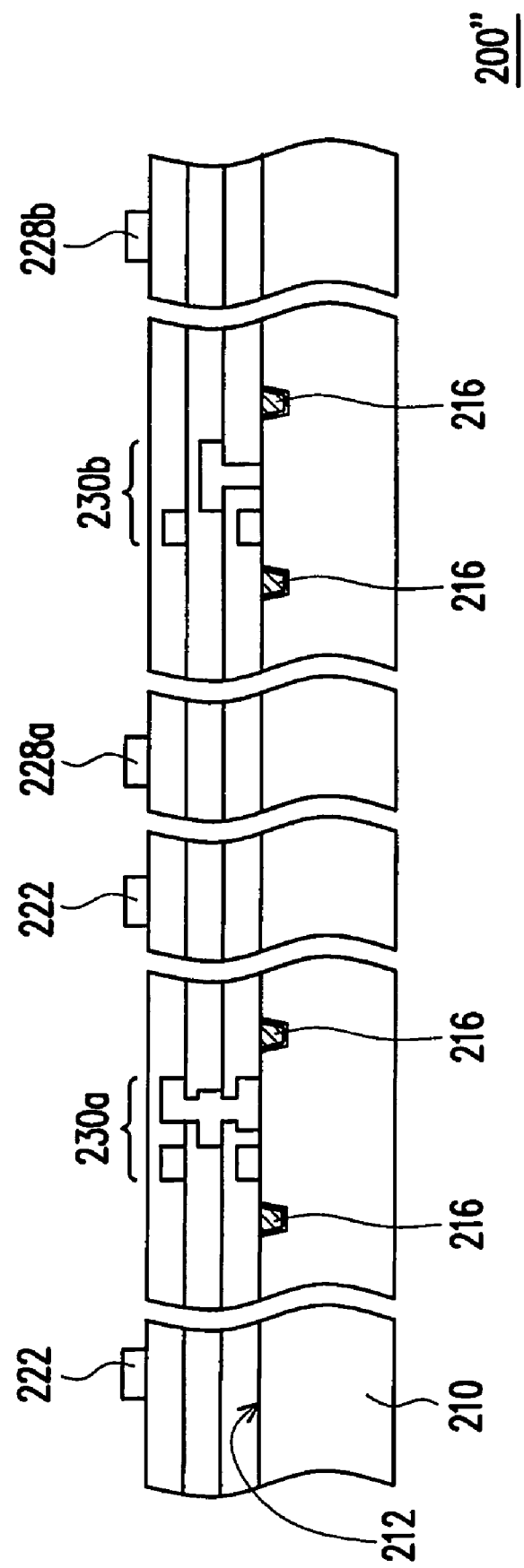
FIG. 9 is a cross-sectional view of the semiconductor chip from the C-C' sectional line of FIG. 8.

FIG. 8 is a partial top view of an IC chip according to yet another embodiment of the present invention. FIG. 9 is a cross-sectional view of the semiconductor chip viewing from the C-C' sectional line of FIG. 8. Referring to FIGS. 8 and 9, in the semiconductor chip 200" of the present embodiment, the circuit region 230a surrounded by the dielectric ring 216 is surrounded by the guard ring 222 in their projections on the substrate surface 212 of the substrate 210, and the circuit region 230b surrounded by the dielectric ring 216 is surrounded by the guard rings 228 in their projections on the substrate surface 212 of the substrate 210. It is to be noted that the guard ring 222 is a continuous ring structure, and the guard rings 228 are two separated arc structures (from the top view). Specifically, the guard rings 228 include a first arc segment 228a, a second arc segment 228b, a first interval 228c and a second interval 228d. The segments (228a and 228b) and the intervals (228c and 228d) of the same guard ring 228 extend sequentially and alternatively.

It is noted that both of the guard ring 222 and the guard ring 228 are not electrically coupled to the same ground contact 226. If any short-cut is formed between the guard ring 222 and the guard ring 228, the interference between these two circuit regions 230a and 230b is easily achieved through the guard ring 22, the ground ring 228 and the short-cut between of them.

Accordingly, the first arc segment 228a and the second arc segment 228b can be electrically coupled to the individual ground contacts 226, respectively. Therefore, comparing with the guard ring 222 for protecting the circuit region 230a, the guard rings 228b are more powerful in protecting the circuit region 230b from being interfered by the noise. Moreover, the present invention is not necessarily limited by the present embodiment, and the guard ring 228 may be formed by a plurality of individual segments in different shapes, wherein the individual segments may be formed of the same conductive layer.

Figure 10:
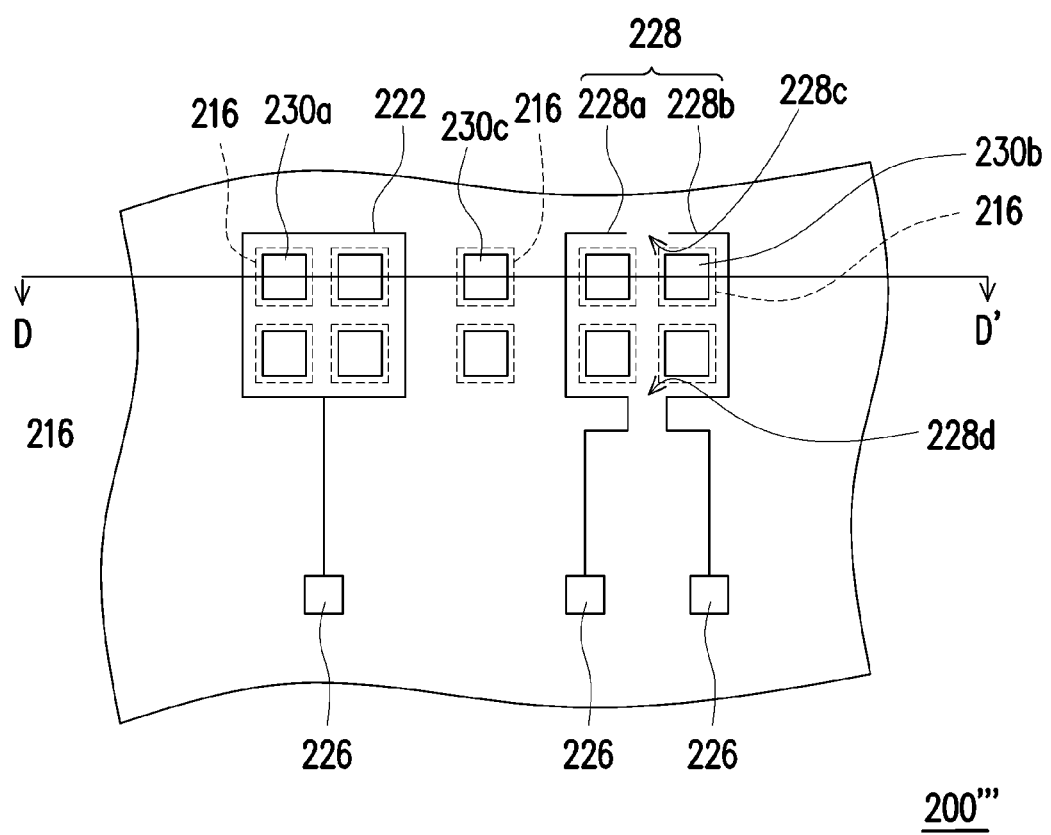
FIG. 10 is a partial top view of an IC chip according to another embodiment of the present invention.
Figure 11:
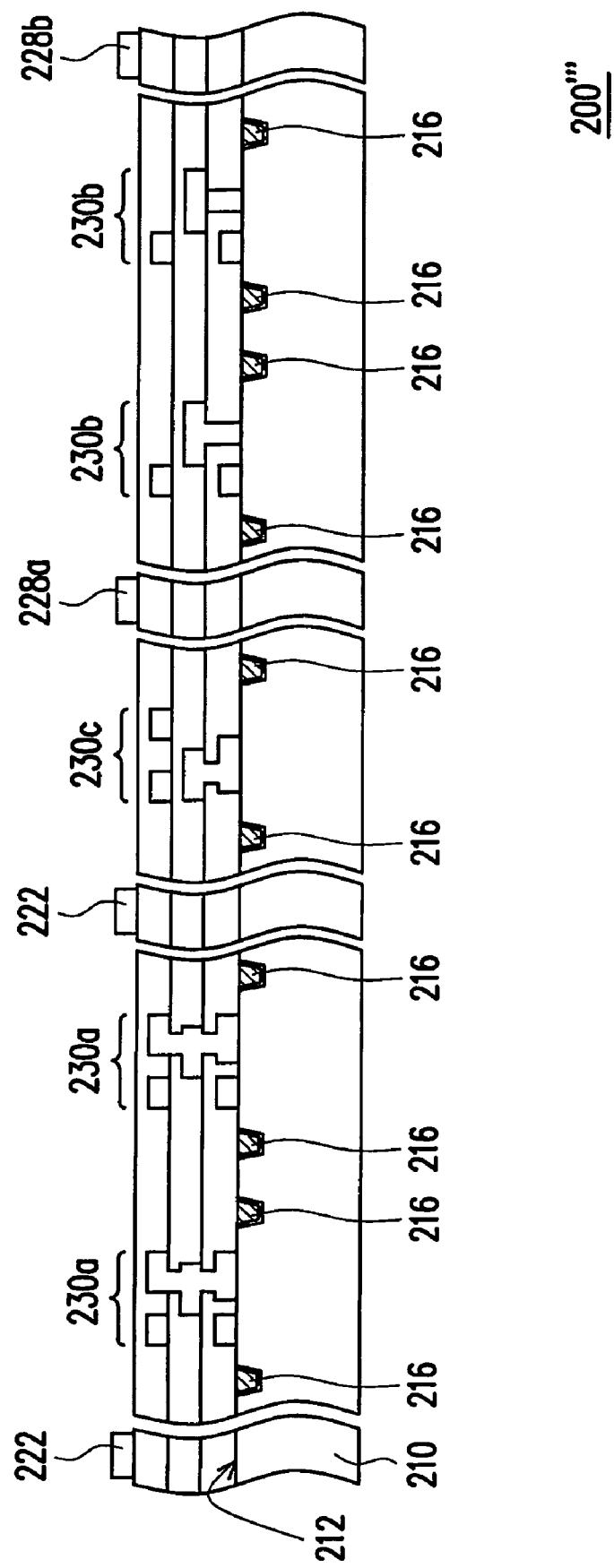
FIG. 11 is a cross-sectional view of the semiconductor chip from the D-D' sectional line of FIG. 10.

FIG. 10 is a partial top view of an IC chip according to another embodiment of the present invention. FIG. 11 is a cross-sectional view of the semiconductor chip from the D-D' sectional line of FIG. 9. Referring to FIGS. 10 and 11, in the semiconductor chip 200''' of the present embodiment, the guard ring 222 surrounds a plurality of the circuit regions 230a respectively surrounded by the dielectric rings 216 in their projections on the substrate surface 212 of the substrate 210, and the guard ring 228 having the segments (228a and 228b) and the intervals (228c and 228d) surrounds a plurality of the circuit regions 230b respectively surrounded by the dielectric rings 216 in their projections on the substrate surface 212 of the substrate 210. There may be one or more circuit regions 230c are not surrounded by a shielding structure such as the guard ring 222 or the guard ring 228 in their projections on the substrate surface 212 of the substrate 210.

In summary, if the dielectric ring(s) and the guard ring(s) of the present invention are regarded as a shielding structure, the projection of the shielding structure on the substrate surface surrounds that of the contact, component or circuit to be protected on the substrate surface, and the projection of the guard ring on the substrate surface surrounds that of the dielectric ring and that of the circuit on the substrate surface. Accordingly, the shielding structure of the present invention protects the circuit from being interfered, and the semiconductor chip provided by the present invention has better performance.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. A semiconductor chip, comprising:
   a substrate having at least a dielectric ring on a substrate surface of the substrate;
   a metal interconnection structure disposed on the substrate surface and having at least a guard ring and a plurality of ground contacts, wherein the guard ring comprises a plurality of individual segments and a plurality of intervals, each of the individual segments is electrically coupled to a corresponding ground contact, and the individual segments and the intervals of the same guard ring extend sequentially and alternatively; and
   a circuit region disposed on the substrate, wherein a projection of the dielectric ring on the substrate surface surrounds a projection of the circuit region on the substrate surface, and a projection of the guard ring on the substrate surface surrounds the projection of the dielectric ring on the substrate surface and the projection of the circuit region on the substrate surface.

2. The semiconductor chip of claim 1, wherein the substrate has a plurality of dielectric rings on the substrate surface, the projections of the dielectric rings on the substrate surface surround the projection of the circuit region on the substrate surface, and the dielectric rings are separated from each other.

3. The semiconductor chip of claim 1, wherein the individual segments are formed of the same conductive layer.

4. The semiconductor chip of claim 1, wherein the metal interconnection structure comprises a plurality of guard rings, and the guard rings are formed in the metal interconnection structure, the guard rings are separated from each other and projections of the guard rings on the substrate surface surround the projection of the dielectric ring on the substrate and the projection of the circuit region on the substrate surface.

5. The semiconductor chip of claim 1, wherein the circuit region comprises a signal contact, and the signal contact is formed from a conductive layer of the metal interconnection structure.

6. The semiconductor chip of claim 1, wherein the circuit region comprises a circuit component, and the circuit component comprising at least an active solid-state device, a passive device, or a combination of the active solid-state device and the passive device.

7. The semiconductor chip of claim 1, wherein the circuit region comprises a circuit component, and the circuit component is a transmitter, a receiver, a power amplifier, a voltage controlled oscillator (VCO), or a combination thereof.

8. The semiconductor chip of claim 1, wherein the circuit region comprises a circuit module, and the circuit module is a memory module, a power supply module, a passive circuit module, a control & logic module, a transmitter module, or a receiver module.

9. A shielding structure suitable for a semiconductor chip including a substrate, a metal interconnection structure, and a circuit region, wherein the metal interconnection structure having a plurality of ground contacts is disposed on a substrate surface of the substrate, and the circuit region is disposed on the substrate, and the shielding structure comprises:
at least a dielectric ring on the substrate surface, and wherein a projection of the dielectric ring on the substrate surface surrounds a projection of the circuit region on the substrate surface; and
at least a guard ring formed of one of a plurality of interleaved conductive layers of the metal interconnection structure, wherein the guard ring comprises a plurality of individual segments and a plurality of intervals, each of the individual segments is electrically coupled to a corresponding ground contact, the individual segments and the intervals of the same guard ring extend sequentially and alternatively, and a projection of the guard ring on the substrate surface surrounds the projection of the dielectric ring on the substrate surface and the projection of the circuit region on the substrate surface.

10. The shielding structure of claim 9, further comprising a plurality of dielectric rings on the substrate surface, wherein projections of the dielectric rings on the substrate surface surround the projection of the circuit region on the substrate surface, and the dielectric rings are separated from each other.

11. The shielding structure of claim 9, wherein the individual segments are formed of the same conductive layer.

12. The shielding structure of claim 9, further comprising a plurality of guard rings that are formed from a plurality of interleaved conductive layers of the metal interconnection structure, and projections of the guard rings on the substrate surface surround the projection of the dielectric ring on the substrate and the projection of the circuit region on the substrate surface.

13. The shielding structure of claim 9, further comprising a plurality of guard rings that are formed in the metal interconnection structure, the guard rings are separated from each other and projections of the guard rings on the substrate surface surround the projection of the dielectric ring on the substrate and the projection of the circuit region on the substrate surface.

14. A semiconductor chip, comprising:
a substrate having at least a deep trench;
a metal interconnection structure having a plurality of ground contacts and disposed on a surface of the substrate; and
a plurality of circuit regions disposed on the substrate, and at least a circuit region is surrounded by a shielding structure, the shielding structure comprising:
at least a dielectric ring in the deep trench, wherein a projection of the dielectric ring on the substrate surface surrounds a projection of the circuit region on the substrate surface; and
at least a guard ring formed by one of a plurality of interleaved conductive layers of the metal interconnection structure, wherein a projection of the guard ring on the substrate surface surrounds the projection of the dielectric ring on the substrate surface and the projection of the circuit region on the substrate surface, the guard ring comprises a plurality of individual segments and a plurality of intervals, the individual segments are formed of the same conductive layer, each of the individual segments is electrically coupled to a corresponding ground contact, and the individual segments and the intervals of the same guard ring extend sequentially and alternatively.

15. The semiconductor chip of claim 14, wherein the substrate has a plurality of dielectric rings in the corresponding deep trenches, the projections of the dielectric rings on the substrate surface surround the projection of the circuit region on the substrate surface, and the dielectric rings are separated from each other.

16. The semiconductor chip of claim 14, wherein the metal interconnection structure comprises a plurality of guard rings, and the guard rings are formed in the metal interconnection structure, the guard rings are separated from each other and projections of the guard rings on the substrate surface surround the projection of the dielectric ring on the substrate and the projection of the circuit region on the substrate surface.

17. The semiconductor chip of claim 14, wherein the dielectric ring is formed by a silicon oxide layer and a polycide layer, the silicon oxide layer is disposed on the inner surface of the deep trench, and the polycide layer is disposed on the silicon oxide layer.

18. The semiconductor chip of claim 1, wherein the number of the individual segments of the same guard ring is two, and the number of the intervals is two.

19. The shielding structure of claim 9, wherein the number of the individual segments of the same guard ring is two, and the number of the intervals is two.

20. The semiconductor chip of claim 14, wherein the number of the individual segments of the same guard ring is two, and the number of the intervals is two.

21. A semiconductor chip, comprising:
a substrate;
a metal interconnection structure having a plurality of conductive layers disposed on a surface of the substrate and having a plurality of contacts on a topmost layer of the conductive layers;
at least a circuit region disposed on the substrate; and
a shielding structure comprising:
at least a dielectric ring in a deep trench on the substrate, wherein the dielectric ring is formed by a silicon oxide layer and a polycide layer, the silicon oxide layer is disposed on the inner surface of the deep trench, and the polycide layer is disposed on the silicon oxide layer; and
at least a guard ring electrically coupled to at least one of the contacts, wherein a projection of the dielectric ring on the substrate surface surrounds a projection of the circuit region on the substrate surface and a projection of the guard ring on the substrate surface surrounds the projection of the dielectric ring on the substrate surface and the projection of the circuit region on the substrate surface.

22. The semiconductor chip of claim 21, wherein the guard ring comprises a plurality of individual segments, and each of the individual segments is individually and electrically coupled to the corresponding contacts.

23. The semiconductor chip of claim 21, wherein the guard ring comprises a plurality of individual segments formed in one of the conductive layers.

24. The semiconductor chip of claim 21, wherein the circuit region comprises at least on active solid-state device coupled to one of the contacts.

* * * * *